United States Patent
Moyer et al.

(10) Patent No.: US 8,291,305 B2
(45) Date of Patent: Oct. 16, 2012

(54) ERROR DETECTION SCHEMES FOR A CACHE IN A DATA PROCESSING SYSTEM

(75) Inventors: William C. Moyer, Dripping Springs, TX (US); Quyen Pho, Austin, TX (US); Michael J. Rochford, Round Rock, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 918 days.

(21) Appl. No.: 12/205,222

(22) Filed: Sep. 5, 2008

(65) Prior Publication Data

US 2010/0064206 A1    Mar. 11, 2010

(51) Int. Cl.
*H03M 13/00* (2006.01)
(52) U.S. Cl. ....................................................... 714/799
(58) Field of Classification Search .............. 714/25–30, 714/32, 718, 724, 754, 758, 764, 765, 766, 714/768, 774, 798–805
See application file for complete search history.

(56) References Cited

U.S. PATENT DOCUMENTS

| | | | |
|---|---|---|---|
| 5,479,641 A * | 12/1995 | Nadir et al. .................... | 711/128 |
| 5,488,691 A | 1/1996 | Fuoco et al. | |
| 5,630,055 A | 5/1997 | Bannon et al. | |
| 5,761,705 A | 6/1998 | DeKoning et al. | |
| 5,875,201 A * | 2/1999 | Bauman et al. ................ | 714/800 |
| 5,958,068 A * | 9/1999 | Arimilli et al. ............... | 714/6.13 |
| 5,961,660 A | 10/1999 | Capps, Jr. et al. | |
| 6,092,182 A | 7/2000 | Mahalingaiah | |
| 6,567,952 B1 * | 5/2003 | Quach et al. ................... | 714/800 |
| 6,571,317 B2 * | 5/2003 | Supnet ........................... | 711/133 |
| 6,654,925 B1 | 11/2003 | Meaney et al. | |
| 6,804,763 B1 | 10/2004 | Stockdale et al. | |
| 6,804,799 B2 | 10/2004 | Zuraski, Jr. | |
| 6,898,738 B2 * | 5/2005 | Ryan et al. ...................... | 714/42 |
| 7,124,170 B1 | 10/2006 | Sibert | |
| 7,254,748 B1 | 8/2007 | Wright et al. | |
| 7,310,709 B1 * | 12/2007 | Aingaran et al. ............. | 711/144 |

(Continued)

FOREIGN PATENT DOCUMENTS

EP    0418457 B1    1/1997

OTHER PUBLICATIONS

RISC Microprocessor Family Reference Manual Rev.5 , Programming Environments Manual, Jan. 2005, Title Page, Information Page, Table of Contents and Chapter 3 (pp. 3-1 thru 3-101), Freescale Semiconductor, Inc.

(Continued)

*Primary Examiner* — Nadeem Iqbal
(74) *Attorney, Agent, or Firm* — Joanna G. Chiu

(57) ABSTRACT

A method includes providing a cache; and providing a plurality of cache lines within the cache, wherein a first one of the plurality of cache lines has a tag entry and a data entry, wherein the tag entry has a parity field for storing one or more parity bits associated with a first portion of the tag entry, wherein the tag entry has an EDC field for storing one or more EDC check bits associated with a second portion of the tag entry and wherein the EDC check bits are used for detecting multiple bit errors, and wherein both the first parity field and the EDC field are stored in the tag entry of said first one of the plurality of cache lines.

20 Claims, 5 Drawing Sheets

U.S. PATENT DOCUMENTS

| | | | |
|---|---|---|---|
| 7,366,829 B1 * | 4/2008 | Luttrell et al. | 711/108 |
| 7,461,321 B2 * | 12/2008 | Lesartre | 714/756 |
| 7,478,274 B2 | 1/2009 | Nishida et al. | |
| 7,941,586 B2 | 5/2011 | Kim | |
| 8,010,872 B2 | 8/2011 | Hashimoto et al. | |
| 2003/0018936 A1 * | 1/2003 | Ryan et al. | 714/723 |
| 2003/0084369 A1 | 5/2003 | Kane et al. | |
| 2003/0131277 A1 * | 7/2003 | Taylor et al. | 714/5 |
| 2005/0132263 A1 | 6/2005 | Anderson et al. | |
| 2007/0044004 A1 | 2/2007 | Hino et al. | |
| 2007/0079184 A1 * | 4/2007 | Weiss et al. | 714/718 |
| 2008/0140962 A1 | 6/2008 | Pattabiraman et al. | |
| 2009/0150720 A1 | 6/2009 | Rafaeli et al. | |

OTHER PUBLICATIONS

U.S. Appl. No. 12/112,580, filed Apr. 30, 2008.

PCT/US2009/048772 International Search Report and Written Opinion mailed Dec. 31, 2009 in corresponding application.

Notice of Allowance mailed Oct. 3, 2011 in U.S. Appl. No. 12/205,210.

Notice of Allowance mailed Dec. 28, 2011 in U.S. Appl. No. 12/205,210.

Office Action mailed Mar. 29, 2012 in U.S. Appl. No. 12/204,989.

* cited by examiner

US 8,291,305 B2

ERROR DETECTION SCHEMES FOR A CACHE IN A DATA PROCESSING SYSTEM

CROSS-REFERENCE TO RELATED APPLICATION

This application is related to Ser. No. 12/205,210, filed on even date, entitled "Error Detection Schemes for a Unified Cache in a Data Processing System," naming William C. Moyer as inventor, and assigned to the current assignee hereof.

BACKGROUND

1. Field

This disclosure relates generally to data processing systems, and more specifically, to error detection schemes for use in a cache.

2. Related Art

Data caches and instruction caches are typically used in data processing systems. Error detection for these caches improves reliability. Error detection code (EDC), error correction code (ECC), and parity protection types are commonly used to provide error detection and/or error correction for memories. However, the use of EDC/ECC for caches may be problematic, especially for level 1 (L1) caches which have more critical timing constraints than higher level caches. That is, although EDC or ECC typically supports a higher level of error detection as compared to using parity, complexity of the cache is greatly increased and the performance is reduced. In some cases, a higher emphasis is placed on error detection where some performance can be sacrificed to obtain a certain level of safety certification. However, in other cases, it is not possible or desirable to sacrifice performance for additional error detection capabilities. These conflicting needs further increases the difficulties faced when designing caches.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
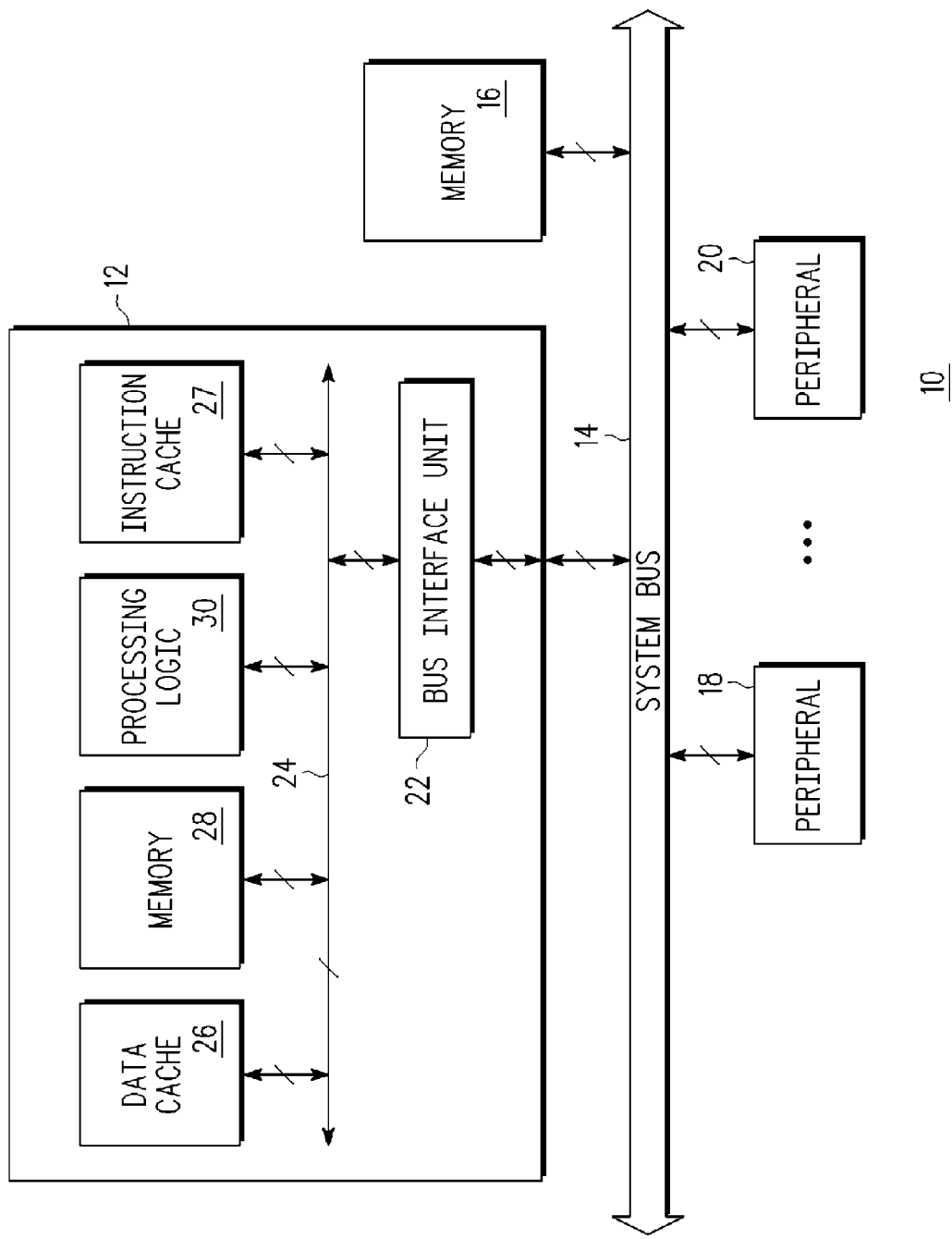
FIG. 1 illustrates, in block diagram form, a data processing system in accordance with one embodiment of the present invention.

Data caches and instruction caches are typically used within data processing systems today. Instruction caches are used to store instruction type information (e.g. instructions) while data caches are used to store data type information (e.g. operands or non-instruction type information). In one embodiment, a tag entry of a data cache or of an instruction cache may use a mixed error detection scheme where a first portion of a tag entry of a cache line uses EDC/ECC while a second portion of the same tag entry of the same cache line uses parity. For example, in one embodiment, EDC/ECC is performed for the tag address of the tag entry while parity checking is performed for the lock and dirty bits. Note that EDC/ECC algorithms use check bits to detect errors where EDC/ECC is able to detect multiple bit errors in the data being checked, and for ECC, to correct a subset of detected errors. In some embodiments, both EDC and ECC are used in order to both detect and then correct the data being checked. However, in other embodiments, only EDC is used in which multiple bit errors can be detected but are not corrected. In this case, as will be described in more detail below, an error notification can be provided since the data is not corrected. Therefore, note that the use of the phrase "EDC/ECC" may refer to doing both EDC and ECC or only EDC. Similarly, the phrase "error detection/correction" may refer to doing both error correction and detection or only error detection. In one embodiment, parity is able to detect single-bit errors in the data being checked and no correction of the single-bit error is performed. Therefore, EDC/ECC is able to provide a higher level of error detection by detecting multiple bit errors while parity detects single bit errors, but at a reduced performance due to the complexity of EDC/ECC.

In general, relative to a parity error detection scheme, EDC/ECC schemes introduce additional delay into the cache data or cache tag access, and thus, in some embodiments, may lower the effective operating frequency of the instruction cache or the data cache. In other embodiments, sufficient time may be available in the processor clock cycle to accommodate EDC//ECC protection. In alternate embodiments, a different amount of time may be available for the tag array data to be provided versus the data array data to be provided. Therefore, it may be possible to use EDC/ECC coding for one array (tag or data) of a given cache, while limiting the error detection type to a simpler (and thus faster) parity scheme for the other array (tag or data) of a given cache. Further, in embodiments with both an instruction cache and a data cache, each including a tag array and a data array, the relative amounts of tolerable delay in performing the error detection/correction may differ, thus allowing for different protection policies to be used for the tag array of one cache versus the tag array of the other cache (instruction cache or data cache), the data array of one cache versus the data array of the other cache (instruction cache or data cache), and further, for the tag array and data array of a given cache.

In one embodiment described herein, different schemes may be used within a system for the instruction cache or the data cache. For example, in one embodiment, the cache data array of the data cache may use a parity scheme while the tag array of the data cache may use an EDC/ECC scheme, and the cache data array of the instruction cache may use an EDC/ECC scheme and the tag array of the instruction cache may use a parity scheme. Note that the cache data array of the instruction cache stores the cache data for the instruction cache which includes instruction type information, whereas the cache data array of the data cache stores the cache data for the data cache which includes data type information such as operands or other non-instruction type information.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, a plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

FIG. 1 illustrates, in block diagram form, a data processing system 10 in accordance with one embodiment of the present invention. Data processing system 10 includes a processor 12, a system bus 14, a memory 16 and a plurality of peripherals such as a peripheral 18, a peripheral 20 and, in some embodiments, additional peripherals as indicated by the dots in FIG. 1 separating peripheral 18 from peripheral 20. Memory 16 is a system memory that is coupled to system bus 14 by a bidirectional conductor that, in one form, has multiple conductors. In the illustrated form each of peripherals 18 and 20 is coupled to system bus 14 by bidirectional multiple conductors as is the processor 12. Processor 12 includes a bus interface unit 22 that is coupled to system bus 14 via a bidirectional bus having multiple conductors. Bus interface unit 22 is coupled to an internal bus 24 via bidirectional conductors. Internal bus 24 is a multiple-conductor communication bus. Coupled to internal bus 24 via respective bidirectional conductors is a data cache 26, an instruction cache 27, a memory 28, and processing logic 30. Processing logic 30 implements data processing operations. In one embodiment, processing logic 30 may be a central processing unit (CPU) of processor 12. Each of data cache 26, instruction cache 27, memory 28, and processing logic 30 are coupled to the internal bus via respective bidirectional conductors. Data cache 26 stores data type information, as described above, and instruction cache 27 stores instruction type information, as described above. Note that memory 28 and memory 16 can be any type of memory, and peripherals 18 and 20 can each be any type of peripheral or device. In one embodiment, all of data processing system 10 is on a single integrated circuit. Alternatively, data processing system 10 can be implemented using more than one integrated circuit. In one embodiment, at least all of processor 12 is on a single integrated circuit.

In operation, processor 12 functions to implement a variety of data processing functions by executing a plurality of data processing instructions. Data cache 26 is a temporary data store for frequently-used data type information that is needed by processing logic 30, and instruction cache 27 is a temporary data store for frequently-used instruction type information that is needed by processing logic 30. In one embodiment, each of data cache 26 and instruction cache 27 is a set-associative cache. Information needed by processing logic 30 that is not within caches 26 or 27 is stored in memory 28 or memory 16. In one embodiment, memory 28 may be referred to as an internal memory where it is internal to processor 12 while memory 16 may be referred to as an external memory where it is external to processor 12. Bus interface unit 22 is only one of several interface units between processor 12 and system bus 14. Bus interface unit 22 functions to coordinate the flow of information related to instruction execution by processing logic 30. Control information and data resulting from the execution of instructions are exchanged between processing logic 30 and system bus 14 via bus interface unit 22.

Figure 2:
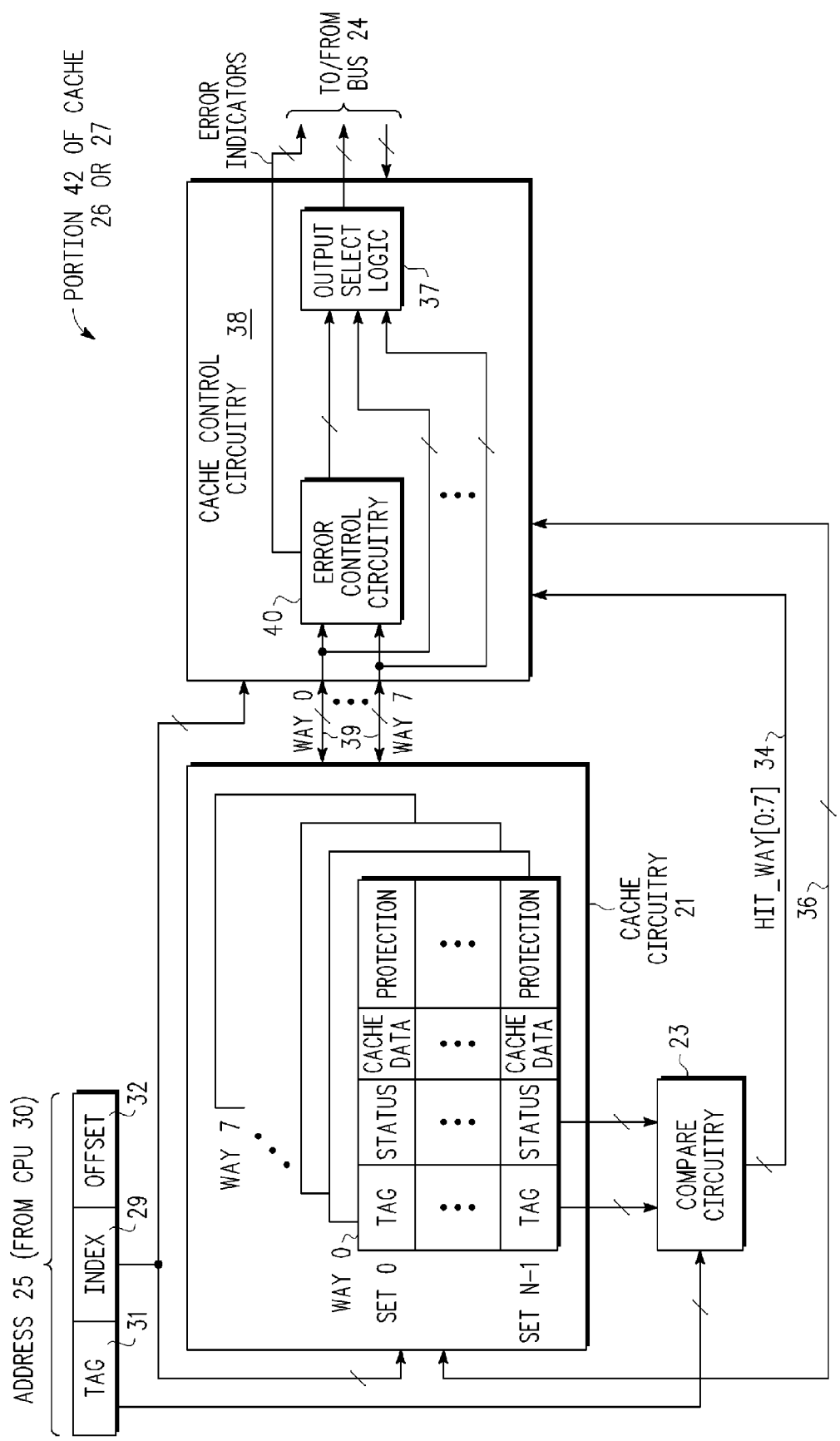
FIG. 2 illustrates, in block diagram form, a portion of a data cache within the data processing system of FIG. 1 or an instruction cache within the data processing system of FIG. 1 in accordance with one embodiment of the present invention.

FIG. 2 illustrates a portion 42 of data cache 26 or instruction cache 27 of FIG. 1 in accordance with one embodiment. That is, the description of FIG. 2 can apply to either data cache 26 or instruction cache 27. Alternate embodiments may use a different structure than that illustrated in FIG. 2. The portion 42 of cache 26 or 27 illustrated in FIG. 2 has "N" sets and 8 ways, and may be referred to as a multi-way cache or as a multi-way set-associative cache. Therefore, the cache of FIG. 2 can be described as having N sets, each set having 8 ways. The cache of FIG. 2, in alternate embodiments, may have any number of sets and any number of ways. Note that, as used herein, a cache line refers to an intersection of a cache way and a set. For example, way 0 includes N cache lines, each corresponding to one of set 0 to set N–1. Therefore, when a way is selected for replacement, the information in one or more cache lines (which is selected by index portion 29, as will be described below) is actually replaced. That is, the entire way may not be replaced, but only one or more particular lines or entries.

In the illustrated embodiment, cache circuitry 21 is storage circuitry which stores information in each of a plurality of cache lines or entries. For example, cache circuitry 21 includes tag, status, cache data, and protection fields for the cache lines or entries. Therefore, note that the tag field of a cache line (or cache entry) may be referred to as a tag entry and the cache data field of a cache line (or cache entry) may be referred to as a cache data entry. Each cache line therefore includes both a tag entry and a cache data entry, where, in the case of data cache 26, the cache data entry stores data type information and, in the case of instruction cache 27, the cache data entry stores instruction type information. Address 25 is provided from processing logic 30. Address 25 includes a tag portion 31, an index portion 29, and an offset portion 32. Index portion 29 is provided to cache circuitry 21 which indicates a particular cache line or entry (i.e. one of set 0 to set N–1). Compare circuitry 23 is coupled to receive tag portion 31 and is coupled to cache circuitry 21 to receive tag and status information. Based on this received information, compare circuitry 23 determines whether there has been a cache hit or a cache miss. In the illustrated embodiment, a plurality of hit/miss signals labeled HIT_WAY[0:7] 34 are provided to cache control circuitry 38. Each HIT_WAY[0:7] 34 signal indicates whether or not there has been a cache hit for its corresponding way in cache circuitry 21. Alternate embodiments may use a cache miss signal in addition to or instead of a cache hit signal.

Cache control circuitry 38 is coupled to cache circuitry 21 by way of conductors or signals 36 and 39. Index portion 29 is also provided to the cache control circuitry 38 for indicating a particular cache line or entry (i.e. one of set 0 to set N–1) Cache control circuitry 38 includes output select logic 37 and error control circuitry 40. Error control circuitry 40 is coupled to cache circuitry 21 and output select logic 37. Error control circuitry 66 may also provide one or more error indicators to bus 24. Output select logic is coupled to receive information from cache circuitry 21 and error control circuitry 40, and provides information to bus 24. Cache control circuitry 38 is also coupled to receive information from bus 24.

In the illustrated embodiment, cache circuitry 21 may correspond to a dedicated cache, such as a data cache which is capable of storing data type information or an instruction cache which is capable of storing instruction type information. In yet another embodiment, portion 42 of FIG. 2 may be a portion of a unified cache where cache circuitry 21 is capable of storing multiple types of information (such as both data type and instruction type information).

Although one type of architecture for cache 26 has been illustrated in FIG. 2, alternate embodiments of may use any desired or appropriate architecture. The architecture illustrated in FIG. 2 is merely intended to be one possible representative architecture. Any cache architecture that allows for the desired cache operations may be used.

Referring to FIG. 2, in operation, index portion 29 is used to select a set in cache circuitry 21. The tag information from cache circuitry 21 is compared to tag 31 and qualified by status information (e.g. valid bits) from cache circuitry 21. The result of the compare and qualification (e.g. match and valid) determines whether or not a cache hit occurs. As described above, each HIT_WAY[0:7] 34 signal indicates whether or not there has been a cache hit for its corresponding way in cache circuitry 21.

In the case of a read access to cache 26, upon a cache hit, the cache data and protection fields of the cache line which resulted in the cache hit are provided, via conductors 39, to cache control circuitry 38. In one embodiment, the protection field of the cache line provides protection bits corresponding to the cache data field of the cache line. Depending on the embodiment, the protection bits may either be check bits for use with an EDC/ECC scheme (multiple bit error detection/correction scheme) or parity bits for use with a parity scheme (single bit error detection scheme). Error control circuitry 40 performs the appropriate error detection/correction (EDC/ECC or parity) on the received cache data using the received protection information. The cache data can then be provided to bus 24 via output select logic which, using HIT_WAY[0:7] 34, selects the output of the corresponding way which resulted in the cache hit (from, e.g., conductors 39). Also, note that an error indicator can also be provided to bus 24 via output select logic 37 to indicate whether or not an error has occurred. Note that if error correction is also being performed, then the corrected cache data from error control circuitry 40 will be output via output select logic 37 rather than the data provided from cache circuitry 21. Furthermore, if corrected cache data is being provided, the error indicator may be negated to indicate that there is no error with the cache data being provided (since it has been corrected).

In the case of a write access to cache 26, upon a cache hit, information (e.g. the cache data for storage into cache circuitry 21) can be received from bus 24 by cache control circuitry 38. The cache data can be provided by cache control circuitry 38 for storage into the appropriate cache line of cache circuitry 21 via conductors 39. Also, cache control circuitry 38 can appropriately update the status field of the cache line. (Note that the specific circuitry used to receive the cache data and route it to the line within cache circuitry 21 which caused the hit and to update the status information is not illustrated, since it is well understood in the art.) The received cache data is also provided to error control circuitry 40 to generate the appropriate protection information (e.g. to generate EDC/ECC check bits or to generate parity bits). This corresponding protection information may also be provided, along with the received cache data, by cache control circuitry 38 for storage into the appropriate cache line of cache circuitry 21 which resulted in the cache line hit. Note that if error correction is also being performed, then the corrected received cache data (if an error was detected) will be provided for storage into cache circuitry 21.

In the case of a cache miss, cache control circuitry 38 identifies a cache line for replacement and updates the cache line. Any known method of cache allocation can be used to select a cache line for replacement, such as, for example, a round robin method, a pseudo-least recently used (PLRU) method, etc. Upon a cache miss, the new cache data for storage into the newly allocated cache line is provided to cache control circuitry 38 by bus 24. The new cache data can then be provided for storage into the newly allocated cache line of cache circuitry 21 via conductors 39. Also, cache control circuitry 38 can appropriately generate the status information for storage into the status field of the newly allocated cache line. (Note that the specific circuitry used to receive the cache data and route it to the newly allocated cache line within circuitry 21 and to generate the status information for the newly allocated cache line is not illustrated, since it is well understood in the art.) The new cache data is also provided to error control circuitry 40 so that error control circuitry 40 can generate the appropriate protection information (e.g. check bits or parity bits). This corresponding protection information may also be provided, along with the received cache data, by cache control circuitry 38 for storage into the newly allocated cache line of cache circuitry 21. Note that if error correction is also being performed, then the corrected new cache data (if an error was detected) will be provided for storage into cache circuitry 21.

As will be described in more detail in reference to FIGS. 3 and 4, error control circuitry 40 may also perform error detection/correction for the tag entry. For example, in the case of a cache access, whether a read access or a write access, the tag field (i.e. tag entry) and status field of the cache lines corresponding to the set selected by index 29 is also provided, via conductors 39, to error control circuitry 40. In one embodiment, all or part of the status field may be considered part of the tag entry. Error control circuitry 40, as will be described in more detail below, performs error correction/detection on the received tag entry. Depending on the type of error correction/detection performed by error control circuitry 40 on the tag entries of the selected set, error control circuitry 40 may provide corrected tag information, via conductors 39, to compare circuitry 23 for performing the comparison to tag 31 to determine a cache hit. Note that if error correction is being performed, then the corrected tag information corresponding to one or more tag entries of the selected set tag (if an error was detected) may be provided for storage into cache circuitry 21 to correct one or more stored errors.

Figure 3:
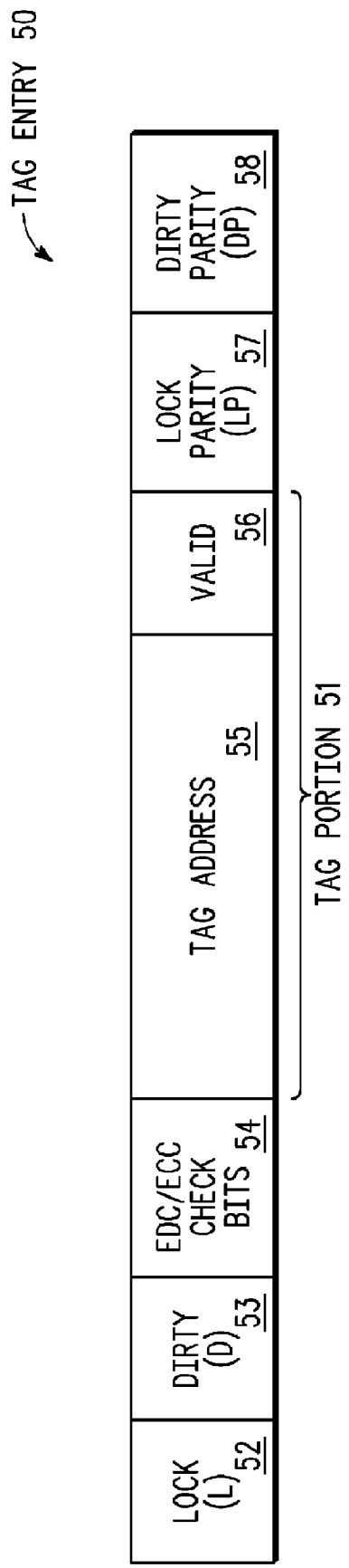
FIG. 3 illustrates in block diagram form, a portion of a tag entry of the cache of FIG. 2 in accordance with one embodiment of the present invention.

FIG. 3 illustrates a tag entry 50 in accordance with one embodiment. Tag entry 50 illustrates the format of a tag field of cache circuitry 21. Therefore, in the embodiments described herein, each tag entry includes some or all of the fields illustrated in FIG. 3. Also, in some embodiments, all or a subset of tag entry 50 may be referred to as tag address information. Referring to FIG. 3, tag entry 50 includes a tag address field 55, a lock field (L) 52 (which may also be referred to as a lock bit) which indicates whether the cache line is locked or not, and a valid field (V) 56 which indicates whether the cache line is a valid cache line. Also, in one embodiment, such as when tag entry 50 corresponds to a data cache such as data cache 26, tag entry 50 may also include a dirty field (D) 53 (which may also be referred to as a dirty bit) which indicates whether or not the cache data field of the cache line is modified compared to the corresponding entry stored in memory (e.g. memory 28 or 16). Note that in the case when tag entry 50 corresponds to an instruction cache such as instruction cache 27, no dirty field may be present. Note that in one embodiment, the status field of the cache line includes additional status information corresponding to the cache line, in addition to the valid, lock, and dirty fields.

Also, as illustrated in FIG. 3, tag entry 50 includes EDC/ECC check bits 54 (also referred to an EDC field or as one or more EDC check bits) corresponding to a first portion of the tag array so that error control circuitry 40 can use the check bits to perform EDC/ECC on the first portion of tag entry 50. In one embodiment, this first portion is tag portion 51 which includes tag address field 55 and valid field 56. Alternatively, tag portion 51 may not include valid field 56. In the illustrated embodiment, tag entry 50 includes parity bits which correspond to a second portion of tag entry 50. For example, tag entry 50 includes a lock parity field (LP) 57 which includes one or more parity bits associated with lock field 52 and dirty parity field (DP) 58 which includes one or more parity bits associated with dirty field 53. (Note that if Dirty Field 53 is not Present, then Dirty Parity Field 58 is Also not Present.) Therefore, note that lock parity field 57, dirty parity field 58, or both fields 57 and 58 may be referred to as a parity field for storing one or more parity bits associated with a second portion (e.g. lock field 52, dirty field 53, or both fields 52 and 53) of tag entry 50. Note also, that in an alternate embodiment, EDC/ECC check bits 54 and parity bits 57 and 58 may also be stored outside tag entry 50, such as in a separate protection field within the cache line, or elsewhere within cache circuitry 21.

Therefore, upon a cache miss, error control circuitry 40 may generate the appropriate protection information for the tag entry (e.g. EDC/ECC check bits 54, LP 57, and/or LD 58). This corresponding protection information for the tag entry may also be provided, along with the received cache data, by cache control circuitry 38 for storage into the newly allocated cache line of cache circuitry 21 (allocation of which was described above). Note that if error correction is also being performed, then the corrected tag portion corresponding to tag portion 51 (if an error was detected) will be provided for storage into cache circuitry 21.

In the illustrated embodiment, cache control circuitry 38 also provides control signals 36 to cache circuitry 21 (e.g. for read/write control). For example, cache control circuitry 38 may, under control of processing logic 30, update cache circuitry 21. For example, processing logic 30 may execute special cache instructions to update status information. Also, in one embodiment, cache control circuitry 38, under control of processing logic 30, such as via special cache instructions, may update protection information. Although FIG. 2 illustrates specific circuitry that may be used to implement a portion 42 of a cache, alternate embodiments may use any desired circuitry. A wide variety of circuit implementations may be used. The circuitry illustrated in FIG. 2 is merely intended to illustrate one possible embodiment.

Figure 4:
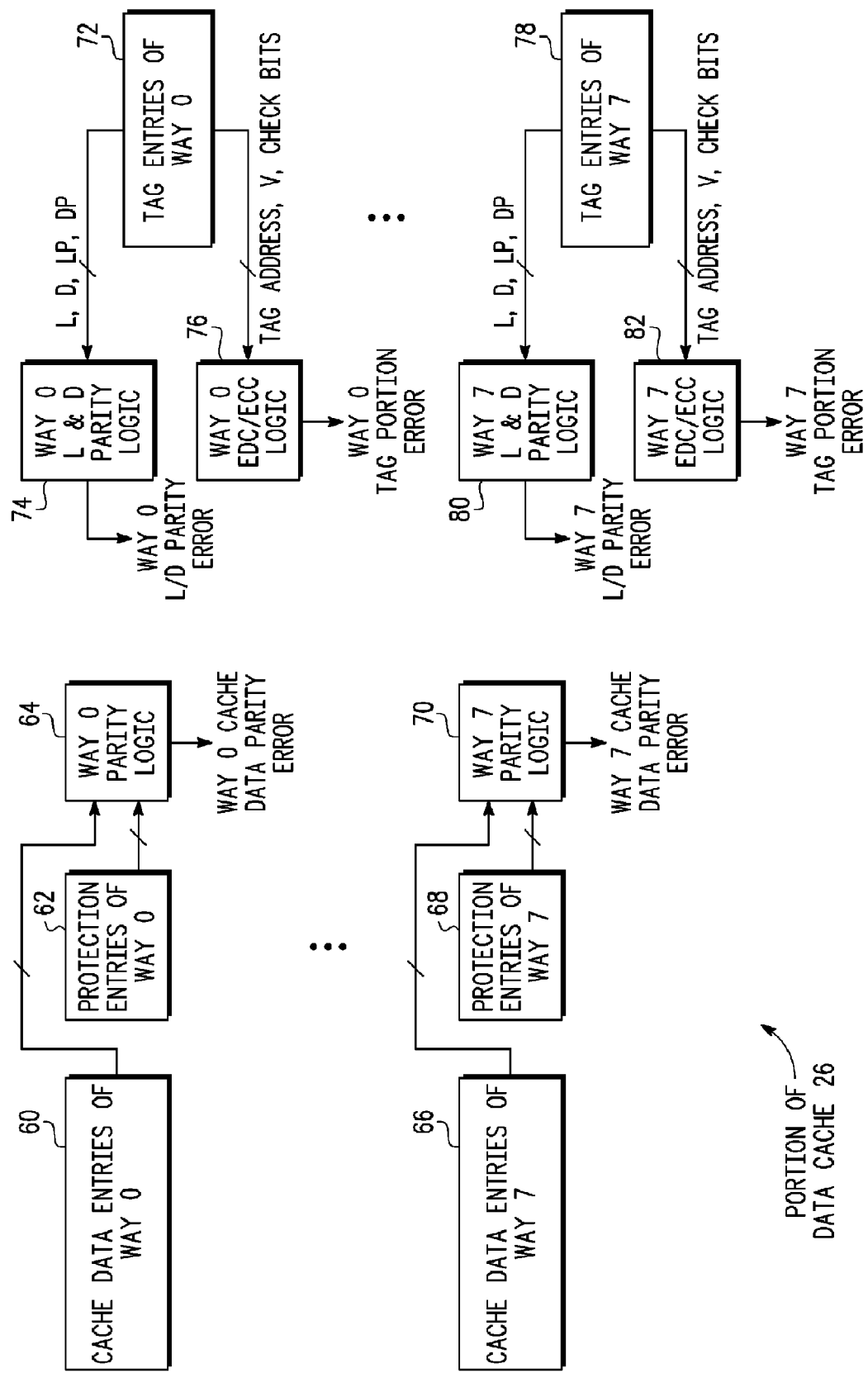
FIG. 4 illustrates, in block diagram form, a portion of the data cache of the data processing system of FIG. 1, in accordance with one embodiment of the present invention.

FIG. 4 illustrates a portion of data cache 26 in accordance with one embodiment of the present invention. Data cache 26 includes cache data entries of way 0 60 through cache data entries of way 7 66, protection entries of way 0 62 through protection entries of way 7 68, way 0 parity logic 64 through way 7 parity logic 70, tag entries of way 0 72 through tag entries of way 7 78, way 0 L and D parity logic 74 through way 7 L and D parity logic 80, and way 0 EDC/ECC logic 76 through way 7 EDC/ECC logic 82. Note that cache data entries of way 0 60 through cache data entries of way 7 66, protection entries of way 0 62 through protection entries of way 7 68, and tag entries of way 0 72 through tag entries of way 7 78 can be considered part of cache circuitry 21 of FIG. 2. Also, note that way 0 parity logic 64 through way 7 parity logic 70, way 0 L and D parity logic 74 through way 7 L and D parity logic 80, and way 0 EDC/ECC logic 76 through way 7 EDC/ECC logic 82 may all be considered part of error control circuitry 40 of FIG. 2.

Way 0 parity logic 64 is coupled to receive the cache data entry of way 0 corresponding to the selected set (selected, for example, by index portion 29 of address 25) and the protection entry of way 0 corresponding to the selected set and, in response thereto, outputs way 0 cache data parity error. Way 7 parity logic 70 is coupled to receive the cache data entry of way 7 corresponding to the selected set (selected, for example, by index portion 29 of address 25) and the protection entry of way 7 corresponding to the selected set and, in response thereto, outputs way 7 cache data parity error. Each of way 0 cache data parity error and way 7 cache data parity error can be provided by error control circuitry 40 as part of error indicators. Therefore, each way would have a corresponding cache data parity error for providing an error indication of whether a single bit parity error exists in the cache data entry of the cache line of the corresponding way. Therefore, note that single bit error detection, using a parity scheme (where parity schemes are known in the art), is used for the cache data entries of data cache 26. Therefore, the protection entries of data cache 26 store parity bits for use in detecting a single-bit error in the corresponding cache data entry of the cache line and providing an error indicator or signal in response thereto.

For the tag entries of data cache 26, a combination of both single-bit error detection (parity) and multiple-bit error detection/correction (EDC/ECC) is used. Each tag entry in data cache 26 has the format of tag entry 50 illustrated in FIG. 3. Therefore, way 0 L and D parity logic 74 is coupled to receive a first portion of the tag entry of way 0 corresponding to the selected set (selected, for example, by index portion 29 of address 25), where this first portion includes the L, D, LP, and DP fields, and in response thereto, provides way 0 L/D parity error. In one embodiment, the LP and DP fields store redundant information to L and D, respectively. In one embodiment, if L=LP, then no parity error is indicated for the L field and if D=DP, then no parity error is indicated for the D field. In an alternate embodiment, if L is not equal to LP, then no parity error is indicated for the L field, and if D is not equal to DP, then no parity error is indicated for the D field. Note that way 0 L/D parity error may include an error indicator for each of the L field and the D field, or may be a combined signal which indicates an error in either the L or D field. In another embodiment, each of the LP and DP fields can include more than one bit such that error correction may also be performed by way 0 L and D parity logic 74. Way 0 EDC/ECC logic 76 is coupled to receive a second portion of the tag entry of way 0 corresponding to the selected set (selected, for example, by index portion 29 of address 25), wherein this second portion includes the tag address, V, and EDC/ECC check bits fields, and in response thereto, provides way 0 tag portion error. Way 0 EDC/ECC logic detects whether a single or multiple bit error exists in the tag portion (tag address and V fields). In one embodiment, if an error is detected, then error correction is also performed by way 0 EDC/ECC logic 76. Note that known EDC and ECC methods may be implemented to perform the multiple bit error detection/correction. For example, in one embodiment, the check bits and tag portion may be used to generate syndrome bits which are processed by an XOR tree, as known in the art, to detect single or multiple bit errors in the tag portion.

Similarly, way 7 L and D parity logic 80 is coupled to receive a first portion of the tag entry of way 7 corresponding to the selected set (selected, for example, by index portion 29 of address 25), where this first portion includes the L, D, LP, and DP fields, and in response thereto, provides way 7 L/D parity error. Way 7 EDC/ECC logic 82 is coupled to receive a second portion of the tag entry of way 7 corresponding to the selected set (selected, for example, by index portion 29 of address 25), wherein this second portion includes the tag address, V, and EDC/ECC check bits fields, and in response thereto, provides way 7 tag portion error. Note that way 7 L and D parity logic 80 is analogous to way 0 L and D parity logic 74 and way 7 EDC/ECC logic 82 is analogous to way 0 EDC/ECC logic 76; therefore, the same descriptions provided for logic 74 and 76 apply to 80 and 82, respectively.

Therefore, each way of data cache 26 would have a corresponding L/D parity error for providing an error indication of whether a single-bit parity error exists in a first portion of the tag entry of the cache line of the corresponding way and a corresponding tag portion error for providing an error indicator of whether a multiple-bit error exists in a second portion of the tag entry (such as corresponding to tag portion 51 of FIG. 3) of the cache line of the corresponding way. Therefore, note that single-bit error detection, using a parity scheme, is used for part of the tag entry while multiple-bit error detection/correction, using an EDC/ECC scheme, is used for another part of the tag entry. Also, known parity and EDC/ECC schemes may be used to implement the error detection/correction.

In one embodiment, data cache 26 allows for partial writes, such as byte, halfword or word writes to a cache line. Therefore, since in one embodiment byte parity rather than EDC/ECC protection for a group of 8 bytes is used for the cache data entries of data cache 26, a read-modify-write (RMW) is avoided because byte parity does not require a RMW for a partial write, while EDC/ECC on a unit of storage including multiple bytes (such as a unit of 8 bytes) requires a RMW cycle to read the existing data (with possible correction), merging the new partial-width write data into the existing multiple byte unit, computing the new EDC/ECC check bits for the multiple byte unit, and writing the resulting data and check bits back into the data entry. In one embodiment, a higher level of error detection is desirable for the tag array; therefore, EDC/ECC is used for the tag entries of data cache 26. However, for portions of the tag entry which are modified separately at different times, such as the L and D fields, it may not be desirable to perform EDC/ECC because, again, a RMW would be required. Therefore, in one embodiment, parity is used for such fields. Note that in alternate embodiments, parity may be used for other or additional fields of the tag field or status field. Also, in one embodiment, data cache 26 is a lowest level cache, such as a level 1 (L1) cache whose timing is more critical as compared to higher level caches, such as level 2 (L2) caches.

Figure 5:
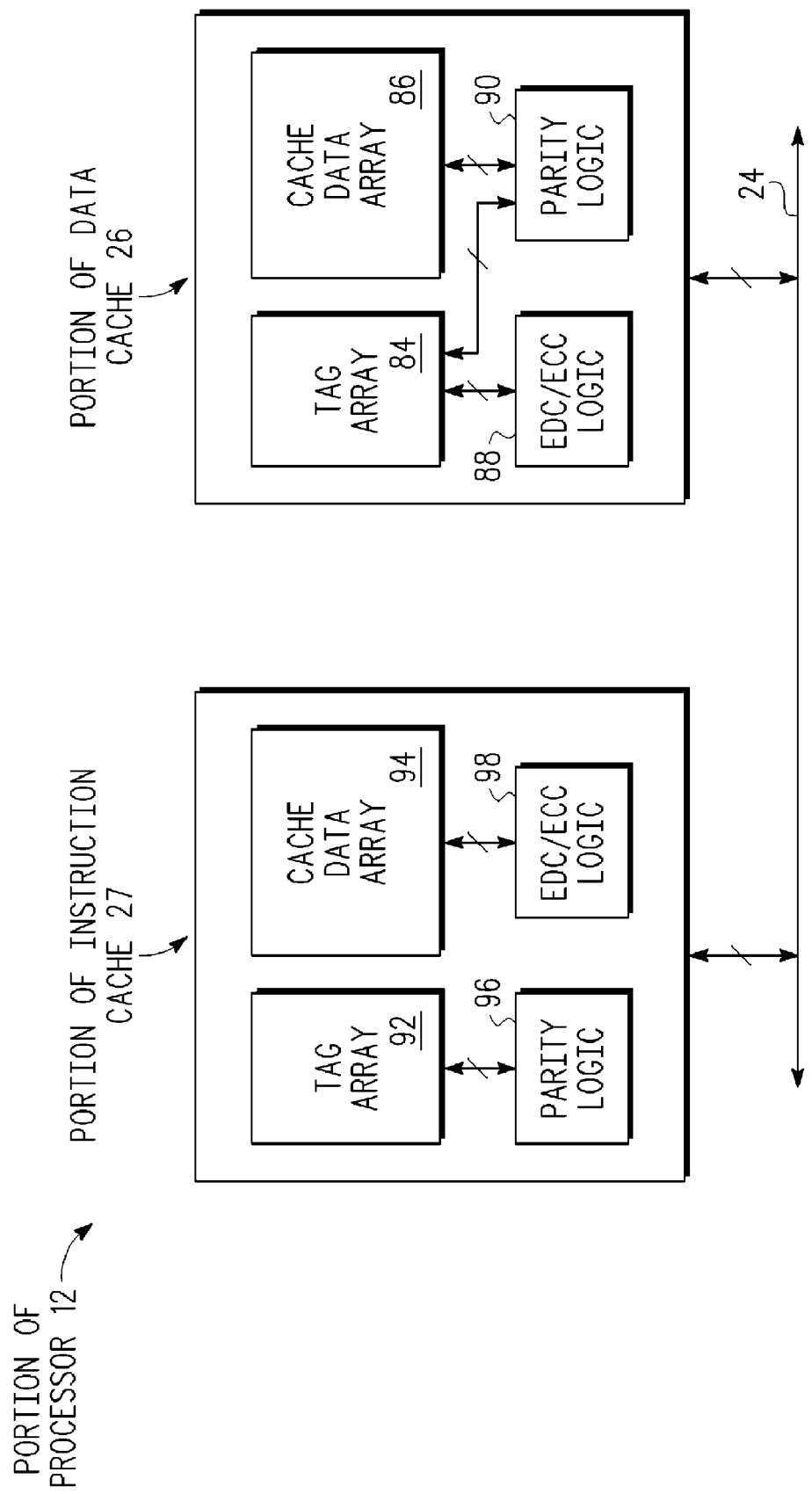
FIG. 5 illustrates, in block diagram form, a portion of the instruction cache of the data processing system of FIG. 1 and a portion of the data cache of the data processing system of FIG. 1, in accordance with one embodiment of the present invention.

FIG. 5 illustrates a portion of processor 12 in accordance with one embodiment of the present invention. Illustrated in FIG. 5 is a portion of instruction cache 27 and a portion of data cache 26. That is, in the illustrated embodiment, processor 12 includes both instruction cache 27 and data cache 26. Instruction cache 27 includes a tag array 92, a cache data array 94, parity logic 96, and EDC/ECC logic 98. Data cache 26 includes a tag array 84, a cache data array 86, EDC/ECC logic 88, and parity logic 90. In the illustrated embodiment of FIG. 5, tag array 84 which stores tag address information (which includes the tag entries of data cache 26 having, for example, the format of tag entry 50) is coupled to EDC/ECC logic 88 and parity logic 90. Cache data array 86 is coupled to parity logic 90. Therefore, in one embodiment, data cache 26 of FIG. 5 is similar to the embodiment of data cache 26 illustrated in FIG. 4, where parity error detection/correction is performed on the cache data array (e.g. the cache data entries of ways 0-7) and a combination of EDC/ECC and parity is performed on the tag array (e.g. tag entries of way 0-7). In one embodiment, the tag entries in the tag array have the format of tag entry 50. In alternate embodiments, the tag entries in the tag array may store different tag address information or have a different format. Also, in an alternate embodiment, the EDC/ECC check bits and the parity bits (e.g. LP and DP) may be stored within EDC/ECC logic 88 and parity logic 90, respectively. Operation of EDC/ECC logic 88 and parity logic 90 is similar to that of parity logic 64, 70, 74, 80, and EDC/ECC logic 76 and 82 of FIG. 4. Also, in one embodiment, cache data array 86 may further include the protection bits or fields (analogous to the protection field of cache circuitry 21 of FIG. 2) or, alternatively, these protection bits may be stored in parity logic 90.

In an alternate embodiment of data cache 26 illustrated in FIG. 5, tag array 84 may not be coupled to parity logic 90. In this alternate embodiment, EDC/ECC may be performed on all or a portion of tag array 84, but no parity may be performed on any part of the tag array.

In the embodiment of the portion of instruction cache 27 illustrated in FIG. 5, tag array 92 (which includes the tag entries of instruction cache 27) is coupled to parity logic 96. Cache data array 94 is coupled to EDC/ECC logic 98. In the embodiment of FIG. 5, note that EDC/ECC logic 98 may perform multiple bit error detection/correction on cache data array 94 (analogous to the cache data entries of cache circuitry 21 of FIG. 2). In this case, the protection bits or fields (analogous to the protection field of cache circuitry 21 of FIG. 2) corresponds to EDC/ECC check bits associated with the cache data field of each cache line. In this case, EDC/ECC logic 98 may perform multiple bit error detection/correction when reading or writing data from or to cache data array 94, as was described above with respect to the example of FIG. 2. In the embodiment of FIG. 5, parity logic 96 may perform single bit error detection on tag array 92 which stores tag address information (analogous to the tag entries of cache circuitry 21 of FIG. 2). In this case, note that each tag entry may include one or more parity bits, such as LP and DP, or the one or more parity bits may be stored in parity logic 96. Also, note that the EDC/ECC check bits described above with respect to tag entry 50 may instead be used to store parity bits associated with all or a portion of the tag entry for performing parity checking. In one embodiment, unlike the data cache 26, instruction cache 27 requires no partial-width write support, since modification of the instruction data storage occurs only on a miss, and the EDC/ECC check bits can be computed just once for the multiple byte data storage units protected by the check bits. In one embodiment, 8-byte units are protected by 8 EDC/ECC check bits.

By using parity protection for the data array in data cache 26, RMW issues can be avoided with updates to the cache data array due to partial-width stores, while improving the level of overall error detection. In the case of instruction cache 27, by using EDC/ECC protection for the data array, a higher level of error detection and optional recovery (if correction is also performed) may be achieved. In instruction caches, partial-width writes are typically not allowed, therefore, EDC/ECC may be used for the cache data array in such an instruction cache without having to deal with RMW issues. Furthermore, in instruction cache designs, the tag array circuit paths may be more timing-critical thus, allowing for parity protection rather than EDC/ECC protection for the tag array in instruction cache 27 may prevent too much loss in performance. Therefore, in the embodiment of FIG. 5, by using different configurations of error detection/correction schemes for the tag and data arrays for instruction and data caches, a balance may be achieved between higher protection when needed and possible while preventing too much loss in performance due to additional timing delays.

Since pipeline delays and timing budgets for the tag and data portions of an instruction cache may differ from the pipeline delays and timing budgets for the tag and data portions of a data cache, and the timing budgets for the tag and data portions within a given cache may also differ, providing the capability of selecting independent error detection and correction policies may be advantageous in the design of data processing systems.

By now it should be appreciated that there has been provided a cache whose tag entries may use a combination of single bit error detection and multiple bit error detection. Furthermore, the error detection schemes for the tag and data arrays for an instruction cache versus a data cache can be independently configured within a same processor to allow for improved operation.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Some of the above embodiments, as applicable, may be implemented using a variety of different information processing systems. For example, although FIG. 1 and the discussion thereof describe an exemplary information processing architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated elements of data processing system 10 are circuitry located on a single integrated circuit or within a same device. Alternatively, data processing system 10 may include any number of separate integrated circuits or separate devices interconnected with each other. For example, memory 16 may be located on a same integrated circuit as processor 12 or on a separate integrated circuit or located within another peripheral or slave discretely separate from other elements of data processing system 10. Peripherals 18 and 20 may also be located on separate integrated circuits or devices. Also for example, data processing system 10 or portions thereof may be soft or code representations of physical circuitry or of logical representations convertible into physical circuitry. As such, data processing system 10 may be embodied in a hardware description language of any appropriate type.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

All or some of the software described herein may be received elements of data processing system 10, for example, from computer readable media such as memory 16 or other media on other computer systems. Such computer readable media may be permanently, removably or remotely coupled to an information processing system such as data processing system 10. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.; and data transmission media including computer networks, point-to-point telecommunication equipment, and carrier wave transmission media, just to name a few.

In one embodiment, data processing system 10 is a computer system such as a personal computer system. Other embodiments may include different types of computer systems. Computer systems are information handling systems which can be designed to give independent computing power to one or more users. Computer systems may be found in many forms including but not limited to mainframes, minicomputers, servers, workstations, personal computers, notepads, personal digital assistants, electronic games, automotive and other embedded systems, cell phones and various other wireless devices. A typical computer system includes at least one processing unit, associated memory and a number of input/output (I/O) devices.

A computer system processes information according to a program and produces resultant output information via I/O devices. A program is a list of instructions such as a particular application program and/or an operating system. A computer program is typically stored internally on computer readable storage medium or transmitted to the computer system via a computer readable transmission medium. A computer process typically includes an executing (running) program or portion of a program, current program values and state information, and the resources used by the operating system to manage the execution of the process. A parent process may spawn other, child processes to help perform the overall functionality of the parent process. Because the parent process specifically spawns the child processes to perform a portion of the overall functionality of the parent process, the functions performed by child processes (and grandchild processes, etc.) may sometimes be described as being performed by the parent process.

Although the invention is described herein with reference to specific embodiments, various modifications and changes can be made without departing from the scope of the present invention as set forth in the claims below. For example, the number of bits used in the address fields may be modified based upon system requirements. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

Item 1 includes a method which includes providing a cache; and providing a plurality of cache lines within the cache, wherein a first one of the plurality of cache lines has a tag entry (for example, 50) and a data entry, wherein the tag entry has a parity field (for example, 57 and/or 58) for storing one or more parity bits associated with a first portion (for example, 52 and/or 53) of the tag entry, wherein the tag entry has an EDC field (for example, 54) for storing one or more EDC check bits associated with a second portion (for example, 51) of the tag entry and wherein the EDC check bits are used for detecting multiple bit errors, and wherein both the parity field and the EDC field are stored in the tag entry of said first one of the plurality of cache lines. Item 2 includes the method of item 1 wherein the second portion of the tag entry comprises one or more tag address bits (for example, 55), and wherein the tag address bits are associated with the EDC field. Item 3 includes the method of item 1, wherein the second portion of the tag entry comprises a valid bit (for example, 56), and wherein the valid bit is associated with the EDC field. Item 4 includes the method of item 1, wherein the first portion of the tag entry comprises a lock bit (for example, 52), and wherein the lock bit is associated with the parity field (for example, 57). Item 5 includes the method of item 1, wherein the first portion of the tag entry comprises a dirty bit (for example, 53), and wherein the dirty bit is associated with the parity field (for example, 58). Item 6 includes the method of item 1, wherein the first portion of the tag entry comprises a lock bit (for example, 52) and a dirty bit (for example, 53), wherein both the lock bit and the dirty bit are associated with the parity field (for example, 57 and 58), and wherein the parity field comprises a plurality of lock parity bits (for example, 57) and a plurality of dirty parity bits (for example, 58). Item 7 include the method of item 1, wherein the cache comprises a level one cache. Item 8 includes the method of item 1, wherein the cache comprises a data cache.

Item 9 includes a cache (for example, 26) which includes a data array (for example, 96) for storing a data entry, wherein the data entry is a first part of a same cache line; and a tag array (for example, 92) for storing a tag entry (for example, 50), wherein the tag entry is a second part of said same cache line, wherein the tag entry includes a parity field (for example, 57 and/or 58) for storing one or more parity bits associated with a first portion (for example, 52 and/or 53) of the tag entry, and an EDC field (for example, 54) for storing one or more EDC check bits associated with a second portion (for example, 51) of the tag entry. The EDC check bits are used for detecting multiple bit errors, and both the parity field and the EDC field are associated with said same cache line. Item 10 includes the cache of item 9, wherein the second portion of the tag entry comprises one or more tag address bits (for example, 55), and wherein the tag address bits are associated with the EDC field. Item 11 include the cache of item 9, wherein the second portion of the tag entry comprises a valid bit (for example, 56), and wherein the valid bit is associated with the EDC field. Item 12 include the cache of item 9, wherein the first portion of the tag entry comprises a lock bit (for example, 52), and wherein the lock bit is associated with the parity field (for example, 57). Item 13 includes the cache of item 9, wherein the first portion of the tag entry comprises a dirty bit (for example, 53), and wherein the dirty bit is associated with the parity field (for example, 58). Item 14 includes the cache of item 9, wherein the first portion of the tag entry comprises a lock bit (for example, 52) and a dirty bit (for example, 53), wherein both the lock bit and the dirty bit are associated with the parity field (for example, 57 and 58), and wherein the parity field comprises a plurality of lock parity bits (for example, 57) and a plurality of dirty parity bits (for example, 58). Item 15 include the cache of item 9, wherein the cache comprises a level one cache. Item 16 include the cache of item 9, wherein the cache comprises a data cache. Item 17 includes an integrated circuit which includes the cache of item 9. Item 18 includes the cache of item 9, and further includes error detection logic (for example, 76, 82), coupled to the tag array (for example, 72), the error detection logic checking the one or more EDC check bits to detect a first error; and parity logic (for example, 74, 80), coupled to the tag array (for example, 72), the parity logic checking the one or more parity bits to detect a second error.

Item 19 includes a method which includes generating one or more lock parity bits (for example, 57) associated with a lock bit (for example, 52); generating one or more dirty parity bits (for example, 58) associated with a dirty bit (for example, 53); generating one or more EDC check bits (for example, 54) associated with a plurality of tag address bits (for example, 55) and a valid bit (for example, 56); storing the one or more lock parity bits and the lock bit within a tag entry of a same single cache line; storing the one or more dirty parity bits and the dirty bit within the tag entry of the same single cache line; and storing the one or more EDC check bits, the plurality of tag address bits, and the valid bit within the tag entry of the same single cache line.

Item 20 includes an integrated circuit which includes an instruction cache and a data cache, wherein the instruction cache includes a first tag array for storing first tag address information; first parity logic, coupled to the first tag array, the first parity logic using one or more first parity bits to detect a first error in the first tag address information; a first cache data array for storing instruction type information; and first EDC logic, coupled to the first cache data array, the first EDC logic using a first plurality of EDC check bits to detect a second error in the instruction type information. The data cache includes a second tag array for storing second tag address information; second EDC logic, coupled to the second tag array, the second EDC logic using a second plurality of EDC check bits to detect a third error in the second tag address information; a second cache data array for storing data type information; and second parity logic, coupled to the second cache data array, the second parity logic using one or more second parity bits to detect a fourth error in the data type information. Item 21 includes the integrated circuit of item 20, wherein the second parity logic is coupled to the second tag array and wherein the second parity logic uses one or more third parity bits to detect a fifth error in the second tag address information.

Item 22 includes an integrated circuit which includes an instruction cache and a data cache, wherein the instruction cache includes a first tag array for storing first tag address information; first parity logic, coupled to the first tag array, the first parity logic using one or more first parity bits to detect a first single-bit error in the first tag address information; a first cache data array for storing instruction type information; first EDC logic, coupled to the first cache data array, the first EDC logic using a first plurality of EDC check bits to detect a first multi-bit error in the instruction type information. The data cache includes a second tag array for storing second tag address information; second EDC logic, coupled to the second tag array, the second EDC logic using a second plurality of EDC check bits to detect a second multi-bit error in the second tag address information; a second cache data array for storing data type information; and second parity logic, coupled to the second cache data array, the second parity logic using one or more second parity bits to detect a second single-bit error in the data type information.

What is claimed is:

1. A method, comprising:
    providing a cache;
    providing a plurality of cache lines within the cache,
        wherein a first one of the plurality of cache lines has a tag entry and a data entry,
        wherein the tag entry has a parity field for storing one or more parity bits associated with a first portion of the tag entry,
        wherein the tag entry has an EDC field for storing one or more EDC check bits associated with a second portion of the tag entry and wherein the EDC check bits are used for detecting multiple bit errors,
        wherein both the parity field and the EDC field are stored in the tag entry of said first one of the plurality of cache lines, and
        wherein the first portion of the tag entry and the second portion of the tag entry are mutually exclusive portions of the tag entry;
    providing a read access to the cache; and
    in response to the read access resulting in a hit of the first one of the plurality of cache lines, providing the first portion of the tag entry and the one or more parity bits to parity logic which detects occurrence of a single-bit parity error in the first portion of the tag entry and providing the second portion of the tag entry and the EDC field to EDC logic which detects occurrence of a multiple-bit error in the second tag portion.

2. The method as in claim 1, wherein the second portion of the tag entry comprises one or more tag address bits, and wherein the tag address bits are associated with the EDC field.

3. The method as in claim 1, wherein the second portion of the tag entry comprises a valid bit, and wherein the valid bit is associated with the EDC field.

4. The method as in claim 1, wherein the first portion of the tag entry comprises a lock bit, and wherein the lock bit is associated with the parity field.

5. The method as in claim 1, wherein the first portion of the tag entry comprises a dirty bit, and wherein the dirty bit is associated with the parity field.

6. The method as in claim 1, wherein the first portion of the tag entry comprises a lock bit and a dirty bit, wherein both the lock bit and the dirty bit are associated with the parity field, and wherein the parity field comprises a plurality of lock parity bits and a plurality of dirty parity bits.

7. The method as in claim 1, wherein the cache comprises a level one cache.

8. The method as in claim 1, wherein the cache comprises a data cache.

9. A cache, comprising:
    a data array for storing a data entry, wherein the data entry is a first part of a same cache line; and
    a tag array for storing a tag entry, wherein the tag entry is a second part of said same cache line,
    wherein the tag entry comprises:
        a parity field for storing one or more parity bits associated with a first portion of the tag entry; and
        an EDC field for storing one or more EDC check bits associated with a second portion of the tag entry,
        wherein the EDC check bits are used in combination with the second portion of the tag entry for generating syndrome bits for detecting multiple bit errors,
        wherein both the parity field and the EDC field are associated with said same cache line, and
        wherein the first portion of the tag entry and the second portion of the tag entry are mutually exclusive.

10. The cache as in claim 9, wherein the second portion of the tag entry comprises one or more tag address bits, and wherein the tag address bits are associated with the EDC field.

11. The cache as in claim 9, wherein the second portion of the tag entry comprises a valid bit, and wherein the valid bit is associated with the EDC field.

12. The cache as in claim 9, wherein the first portion of the tag entry comprises a lock bit, and wherein the lock bit is associated with the parity field.

13. The cache as in claim 9, wherein the first portion of the tag entry comprises a dirty bit, and wherein the dirty bit is associated with the parity field.

14. The cache as in claim 9, wherein the first portion of the tag entry comprises a lock bit and a dirty bit, wherein both the lock bit and the dirty bit are associated with the parity field, and wherein the parity field comprises a plurality of lock parity bits and a plurality of dirty parity bits.

15. The cache as in claim 9, wherein the cache comprises a level one cache.

16. The cache as in claim 9, wherein the cache comprises a data cache.

17. An integrated circuit comprising the cache as in claim 9.

18. The cache as in claim 9, further comprising:
    error detection logic, coupled to the tag array, the error detection logic checking the one or more EDC check bits to detect a first error; and
    parity logic, coupled to the tag array, the parity logic checking the one or more parity bits to detect a second error.

19. A method, comprising:
    generating one or more lock parity bits associated with a lock bit;
    generating one or more dirty parity bits associated with a dirty bit;
    generating one or more EDC check bits associated with a plurality of tag address bits and a valid bit;
    storing the one or more lock parity bits and the lock bit within a tag entry of a same single cache line;
    storing the one or more dirty parity bits and the dirty bit within the tag entry of the same single cache line; and storing the one or more EDC check bits, the plurality of tag address bits, and the valid bit within the tag entry of the same single cache line.

20. An integrated circuit comprising an instruction cache and a data cache,
   wherein the instruction cache comprises:
   a first tag array for storing first tag address information;
   first parity logic, coupled to the first tag array, the first parity logic using one or more first parity bits to detect a first error in the first tag address information;
   a first cache data array for storing instruction type information; and
   first EDC logic, coupled to the first cache data array, the first EDC logic using a first plurality of EDC check bits to detect a second error in the instruction type information; and wherein the data cache comprises:
   a second tag array for storing second tag address information;
   second EDC logic, coupled to the second tag array, the second EDC logic using a second plurality of EDC check bits to detect a third error in the second tag address information;
   a second cache data array for storing data type information; and
   second parity logic, coupled to the second cache data array, the second parity logic using one or more second parity bits to detect a fourth error in the data type information.

* * * * *